United States Patent
Kompalik

(10) Patent No.: US 7,235,132 B2
(45) Date of Patent: Jun. 26, 2007

(54) DURABLE CFC SUPPORT CRUCIBLE FOR HIGH-TEMPERATURE PROCESSES IN THE PULLING OF SEMICONDUCTOR SINGLE CRYSTALS

(75) Inventor: Dieter Kompalik, Wachtberg (DE)

(73) Assignee: SGL Carbon AG, Wiesbaden (DE)

( * ) Notice: Subject to any disclaimer, the term of this patent is extended or adjusted under 35 U.S.C. 154(b) by 316 days.

(21) Appl. No.: 10/846,785

(22) Filed: May 12, 2004

(65) Prior Publication Data
US 2004/0226317 A1 Nov. 18, 2004

(30) Foreign Application Priority Data
May 14, 2003 (DE) ................. 103 21 785

(51) Int. Cl.
*C30B 15/10* (2006.01)
(52) U.S. Cl. ............... 117/200; 117/13; 117/30; 117/213; 117/900
(58) Field of Classification Search ........... 117/200, 117/900, 13, 30, 213
See application file for complete search history.

(56) References Cited

U.S. PATENT DOCUMENTS

| | | | |
|---|---|---|---|
| 5,441,014 A | * | 8/1995 | Tomioka et al. ............ 117/213 |
| 5,919,306 A | * | 7/1999 | Takemura .................... 117/200 |
| 6,136,094 A | | 10/2000 | Yamaji et al. |
| 2002/0134302 A1 | * | 9/2002 | Ferry et al. .................. 117/213 |
| 2002/0185061 A1 | * | 12/2002 | Yamaji et al. ............... 117/213 |
| 2003/0070612 A1 | * | 4/2003 | Addis ......................... 117/213 |

FOREIGN PATENT DOCUMENTS

| | | |
|---|---|---|
| DE | 40 07 053 A1 | 9/1990 |
| DE | 102 19 387 A1 | 12/2002 |
| WO | 96/26791 | 9/1996 |
| WO | 98/48085 | 10/1998 |

* cited by examiner

*Primary Examiner*—Robert Kunemund
(74) *Attorney, Agent, or Firm*—Laurence A. Greenberg; Werner H. Stemer; Ralph E. Locher

(57) ABSTRACT

In order to pull semiconductor single crystals by the Czochralski method, quartz glass crucibles are used which require support crucibles having high temperature capabilities. Such support crucibles may be made of various materials, in which case graphite materials, carbon fiber-reinforced carbon (CFC), combinations thereof or carbon materials coated with silicon carbide (SiC) are used. The working life of a CFC support crucible can be extended by a partial thickening of the support crucible walls affected by corrosion processes.

8 Claims, 1 Drawing Sheet

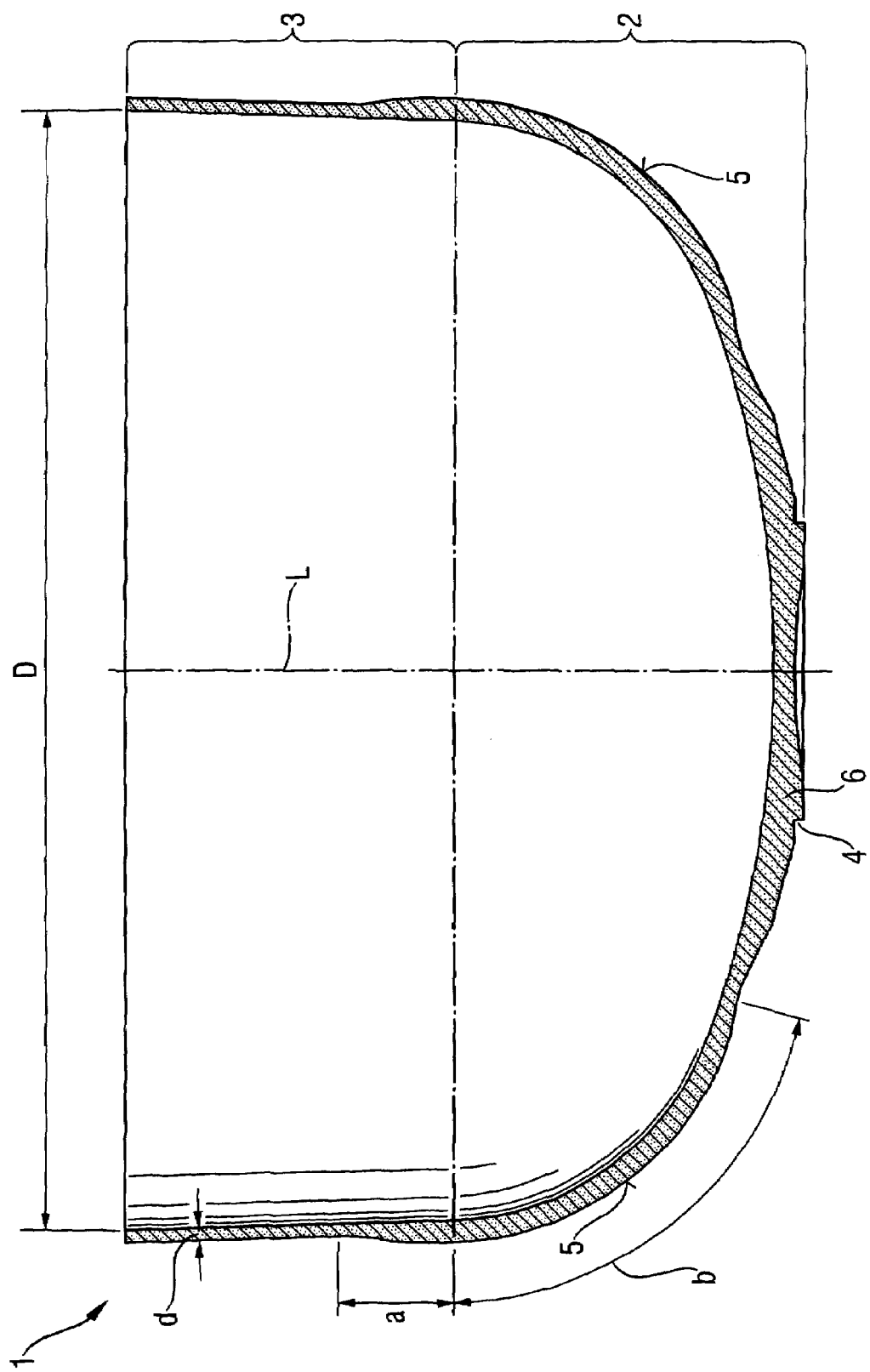

DURABLE CFC SUPPORT CRUCIBLE FOR HIGH-TEMPERATURE PROCESSES IN THE PULLING OF SEMICONDUCTOR SINGLE CRYSTALS

BACKGROUND OF THE INVENTION

Field of the Invention

The invention relates to a support crucible made of a highly pure carbon fiber-reinforced carbon (CFC) produced with the aid of the filament winding method, with an ash value of less than 500 ppm, for supporting quartz glass crucibles. The support and quartz glass crucibles are used together in high temperature processes of semiconductor technology, such as the pulling of single crystals by the Czochralski method from silicon or other semiconductor materials.

The Czochralski method is carried out at 14000 C. At the high temperatures that are employed, the quartz glass crucibles are no longer mechanically stable enough and require support in order to maintain their shape. The support function is fulfilled by crucibles made of graphite, CFC, combinations thereof or carbon materials coated with silicon carbide (SiC), which are still fully stable geometrically under these conditions.

High temperatures are employed in many cases for the production and processing of very pure materials, for example as required in the semiconductor industry. The supports that are used for this must therefore be highly pure and, above all, also thermally stable. Graphite, carbon fiber-reinforced carbon (CFC), combinations thereof or the aforementioned carbon materials coated with silicon carbide are materials that meet these requirements. A disadvantage of graphite and CFC parts that can withstand such conditions, however, is their limited life that is attributable to the effect of chemically active, usually gaseous substances such as oxygen, silicon monoxide, carbon dioxide or even silicon dioxide. This limited durability has negative repercussions on the outlay for the processes respectively being carried out, for example in the pulling of silicon single crystals, and the quartz glass crucibles which are used for this and are directly in contact with graphite, CFC, combinations thereof or carbon materials coated with silicon carbide.

SUMMARY OF THE INVENTION

It is accordingly an object of the invention to provide a durable CFC support crucible for high-temperature processes used in the pulling of semiconductor single crystals which overcomes the above-mentioned disadvantages of the prior art devices of this general type.

With the foregoing and other objects in view there is provided, in accordance with the invention, a support crucible for supporting quartz glass crucibles. The support crucible and the supporting quartz glass crucibles are used together in high temperature processes of semiconductor technology such as a pulling of single crystals by a Czochralski method from silicon or other semiconductor materials. The support crucible contains a wall formed of a highly pure carbon fiber-reinforced carbon (CFC), produced with an aid of a filament winding method, and has an ash value of less than 500 ppm. The wall has a substantially cylindrical, slightly conically widening part and a curved bottom part. The wall has a wall thickness in a transition region from the substantially cylindrical, slightly conically widening part to the curved bottom part being thickened with respect to the substantially cylindrical, slightly conically widening part by at least 15%.

There has been no lack of attempts to develop graphite materials, CFC materials, combinations thereof or carbon materials coated with silicon carbide for the application described above. The aim has been to improve the durability of one-piece support crucibles or ones made up of a plurality of parts. These attempts have, in particular, related to graphite or CFC materials for the production of support crucibles.

To aid understanding of the following text, a few aspects from the field of fiber composites and a few associated definitions will be explained.

Fiber composites are formed of a matrix and reinforcing fibers, which have usually been subjected to a special surface treatment. The fibers are normally converted into the form of a textile intermediate and incorporated as such into the matrix. The matrix may be formed of plastics, metals or ceramic.

In the present case, carbon fibers are introduced in the form of the intended textile intermediate into a matrix of selected organic substances. In a cured state, the composite is referred to as carbon fiber-reinforced plastic, usually by the abbreviation "CFP" in the trade. In a subsequent method step, this material is coked. This produces the carbon fiber-reinforced carbon composite, which is referred to by the usual abbreviation "CFC" in the trade.

Suitable semi-finished products are used in order to rationalize and standardize the production of fiber composites, and to tailor special properties. One possible type of semi-finished product contains a textile intermediate—for example unidirectional carbon fibers or, for example, carbon-fiber fabric which is impregnated with a synthetic resin—for example phenolic resin. Such a semi-finished product is referred to as a prepreg.

Reinforcing fibers are usually produced in the form of a roving. A roving is a bundle of endless, parallel fibers only a few micrometers thick, usually with a round cross section. A roving contains a defined number of elementary fibers, for instance 1,000, 3,000, 6,000 or 12,000 etc.

One method for producing components from fiber composites is the filament winding method. In this method, rovings are impregnated with a synthetic resin and wound onto a core. A (raw) fiber composite component is obtained after curing, mold release and processing.

The CFC support crucibles described in this document are support crucibles produced by the filament winding method.

One possible way of improving the durability of support crucibles is described in International Patent Disclosure WO 98/48085. Material layers between the quartz glass crucible and the graphite support crucible are intended to prevent reactions between these two crucibles (or crucible materials). Such layers are made up of high-melting metals, their carbides, oxides or silicides. The layers are applied to the graphite. The thermodynamic reaction rates of the various reaction partners are described in detail. According to WO 98/48085, additional equipment is required in order to produce the layers, which furthermore need to be applied uniformly. This method furthermore introduces metals into the crystal pulling system, which is highly critical with respect to its purity requirements; these dope the silicon single crystals in an undesirable way and lead to a lower or intolerable quality of the silicon single crystals.

Another way of improving the durability of support crucibles has been pursued by reinforcing conventional types of graphite with carbon fiber-reinforced carbon. German Patent DE 40 07 053 C2 describes the cladding of graphite support crucibles made of two or more segments, which are characterized in that they are provided with a protective CFC layer respectively on their inner surface, facing the quartz glass crucible, the upper edge and on the contact surfaces of the segments.

It has, however, turned out that products or crucibles produced in this way are not used in practice. The CFC in the case of German Patent DE 40 07 053 C2 does not withstand the oxidative effect of the quartz glass crucible any better than the conventional types of graphite.

International Patent Disclosure WO 96/26791 describes CFC support crucibles that are used for the process of pulling silicon single crystals. The lamination method is primarily used for producing the CFC support crucibles, although the filament winding method is also mentioned. This patent focuses on obtaining a highly pure support crucible, rather than on improving the durability of the support crucible.

U.S. Pat. No. 6,136,094 provides more detailed information about the configuration of a wound CFC support crucible, the support crucible being a rotationally symmetric core that is produced primarily by the filament winding method. A number of relatively small fabric parts, or relatively small sections of unidirectional carbon-fiber prepreg, are laminated onto the most highly angled parts of the curved bottom. Lamination of the sections is a difficult and expensive working step needing to be carried out by hand. As a result, the CFC material is furthermore less homogeneous at these positions than at positions that are produced only by the filament winding method. The problem of the support crucible corrosion in the transition region from the cylindrical or substantially cylindrical, slightly conically widening part to the curved bottom part of the support crucible is not discussed.

Published, Non-Prosecuted German Patent Application DE 102 19 387 A1, corresponding to Published U.S. Patent Application 20020185061 A1, describes special winding patterns for the configuration of a wound CFC crucible. Variants are included in which individual winding levels provide annular, bead-like thickenings on the curved CFC crucible bottom. These material thickenings are useful for providing the support crucible with good stability after mechanical processing. In other variants, the winding layers are omitted around the central winding axis. This leads to a support crucible that has a hole at the center of the curved bottom. According to the document, this hole is closed with suitable plugs. The problem of support crucible corrosion in the transition region from the cylindrical or substantially cylindrical, slightly conically widening part to the curved bottom part of the support crucible is not discussed.

There is therefore a need to provide a CFC support crucible which withstands the corrosion in the transition region from the cylindrical or substantially cylindrical, slightly conically widening part to the curved bottom part of the support crucible, due to the gases present at the high working temperatures, for example oxygen, silicon monoxide, carbon dioxide or even silicon dioxide, for a longer time than a CFC support crucible according to the prior art does.

With a CFC support crucible according to the invention, the possible time for which it can be used is extended. The longer life of such a support crucible reduces the specific cost per semiconductor single crystal produced using it. For the production of semiconductor single crystals, only a few substances with high purity are used in the hot production zone. When pulling a silicon single crystal, for example, these are liquid silicon, the silicon single crystal pulled from it, the quartz glass crucible holding the liquid silicon, the CFC crucible supporting the soft quartz glass crucible, as well as the graphite heating elements and heat shields surrounding this configuration and the inner wall of the furnace device. It is expedient to reduce the ash value of the CFC support crucible to less than 500 ppm.

At the high temperatures in the region of 14000° C., these few substances react with one another according to relatively few reaction equations. Some important equations are:

$$Si + SiO_2 \rightarrow 2SiO(g) \tag{1}$$

Gaseous SiO is hence created in small amounts from the liquid silicon and the quartz glass. The carbon of the CFC support crucible also reacts with the quartz glass crucible to form SiO gas according to formula (2):

$$C + SiO_2 \rightarrow SiO(g) + CO(g) \tag{2}$$

The freshly created SiO gas cannot penetrate into the gas-tight quartz glass crucible, so it therefore migrates preferentially into the carbon support crucible lying opposite, especially when the latter is porous. The pores of the carbon support crucible, in particular the CFC support crucible, are filled or sealed with pyrocarbon during its production in order to avoid this. However, the residual porosity of the carbon support crucible is sufficient for the SiO to penetrate and corrode the support crucible according to reaction equation (3):

$$SiO(g) + 2C \rightarrow SiC + CO(g) \tag{3}$$

The carbon support crucible, but also other carbon components, are converted to a small extent, but progressively, into silicon carbide according to reaction equation (3) during the single crystal production. The silicon carbide that is produced has a larger volume than the carbon previously located at the same position in the component. The effects of this volume increase are locally occurring cracks, joints, widenings of the carbon structure, up to flaking and macroscopic destruction. Added to this, small amounts of carbon escape from the carbon part in the form of gaseous CO, so that they leave holes behind. All of these processes are combined under the term "corrosion". The effect of the corrosion is the limited lifetime of, for example, the carbon support crucible.

Damage analyses on support crucibles which have been used for the production of semiconductor single crystals (and which needed to be replaced), show that the corrosion mechanisms described above take place particularly in the transition region from the cylindrical or substantially cylindrical, slightly conically widening part to the curved bottom part of the support crucible.

Under equivalent conditions, the working life of CFC support crucibles produced with the aid of the filament winding method, and having an ash value of less than 500 ppm, for the support of quartz glass crucibles increases from 47 single crystal pulling processes to 73 single crystal pulling processes—that is to say by more than 50 percent—when the CFC support crucible is thickened in the region of greatest corrosion, that is to say in the transition region from the cylindrical or substantially cylindrical, slightly conically widening part to the curved bottom part of the support crucible, with respect to the cylindrical or substantially cylindrical, slightly conically widening part by at least 15%, preferably in a range of from 20 to 50%.

Since virtually all CFC materials are relatively expensive—even compared with conventional electrographite used as a support crucible—it is desirable to use no more material that is absolutely necessary. The thickened parts of the CFC support crucible are therefore limited to the range absolutely necessary. It has been found expedient for the support crucible to have a thickened region amounting to at least 10% of the length of the cylindrical or substantially cylindrical, slightly conically widening part of the support crucible, and for the support crucible to have a thickened region amounting to at least 60% of the length of the section line through the curved bottom of the support crucible from the central longitudinal axis of the support crucible to the start of the cylindrical or substantially cylindrical, slightly conically widening part of the support crucible.

The substances which are involved react with one another as described above at the high working temperatures of the Czochralski method, and give off gases which lead to corrosion of the carbon components involved. It is therefore clear that the components should be produced densely and with a low porosity, as far as possible, in order to prevent the gases from reaching the interior of the component. For components produced by the filament winding method, it is favorable for these to have a dense winding pattern. It has been found expedient for the thickened transition region from the cylindrical or substantially cylindrical, slightly conically widening part to the curved bottom part of the support crucible to contain a CFC material which has fiber strands laid tightly together and without an offset with the filament winding method.

All attempts to extend the working life of carbon support crucibles are aimed at successively reusing a support crucible repeatedly in the Czochralski process and successively producing a plurality of single crystals with the aid of one support crucible. In order to achieve this, a quartz glass crucible with a solidified residual silicon melt should be easy to remove completely from the support crucible after a single crystal pulling process. This is not straightforward, because the quartz glass crucible becomes deformed during a pulling process. If the support crucible had undercuts or only slight narrowings, then the soft quartz glass crucible could sink behind the undercuts or behind the narrowing during the pulling process, and become fixed there. Easy removal of the quartz glass crucible from the support crucible would no longer be possible in the cold state. It has therefore been found expedient for the net inner contour of the support crucible to be configured so that a rotationally symmetric quartz glass crucible located in the support crucible can be removed at any time, that is to say for there to be no narrowing or even undercut toward the open edge of the support crucible. The support crucible thus has a net contour that becomes continuously wider from the central part of the bottom as far as the open support crucible edge—albeit in very differing degrees—without discontinuities.

Since a narrowing or undercut of the net inner contour of the CFC support crucible is not allowable, any thickening of the support crucible can only be applied on the outside. According to the invention, the thickening of the wall of the CFC support crucible in the transition region from the cylindrical or substantially cylindrical, slightly conically widening part to the curved bottom part of the support crucible is present only on the outside, extending away from the central longitudinal axis of the support crucible.

Because of the coking process and the significant amount of volatile components which escape during it, synthetically produced carbons have a high porosity which may constitute about 25 to 35 volume percent of the carbon body. One technique for reducing this porosity and increasing the raw density relates to impregnating the carbon bodies with pitch or other organic macromolecular substances. Part of the porosity can be eliminated with the aid of repeated impregnation and coking steps. A residual porosity nevertheless remains. Another technique for reducing the porosity and increasing the raw density consists in impregnating the carbon bodies with a pyrocarbon. This technique leads to an exceptionally low porosity and high raw density of the synthetically produced carbon.

The latter technique is the preferred way of producing comparatively dense CFC support crucibles. The CFC support crucible that has been coked at least once is infiltrated with pyrocarbon, preferably by a chemical vapor infiltration (CVI) method.

Compared with the wall thickness of a graphite support crucible, a CFC crucible may have a wall size that is smaller by a factor of from three to five. The reasons for this are the variously defined higher strengths of CFC. The lightweight construction and the consequent low mass permit short heating and cooling times and a high productivity in the method. This makes it attractive to use CFC despite its high price.

EXAMPLE

The filament winding method was selected for the first step during production. To that end, graphitized carbon fibers in the form of rovings with 6,000 individual fibers were passed through a bath of phenolic resin, and thereby impregnated. The impregnated roving was laid on a mandrel under a predetermined tension.

The mandrel had the external dimensions that the support crucible to be produced would have as net internal measurements. The mandrel had a dome at one end, the dimensions of which corresponded to the net measurements of the support crucible bottom to be produced on it. The dome of the mandrel had an external contour with differing but rotationally symmetric curvatures, the curvature being least at the dome tip, which coincided with the longitudinal axis of the mandrel, and greatest at a position slightly offset from the transition into the substantially cylindrical part of the mandrel. The external contour of the dome of the mandrel was also to be seen as the internal contour of the CFC support crucible, see the figure. In the central section, the mandrel had a substantially cylindrical, slightly conically widening part with a diameter of about 500 mm, the widening being away from the dome. On the opposite end from the dome, the mandrel had a slim supporting arm, which was fastened at one end in the center of the middle section of the mandrel, and which was clamped into a winding machine at its other end.

The winding machine had a plurality of controllable degrees of freedom that, besides the rotation of the mandrel about its longitudinal axis, also included other possibilities for movement of the heddle. The heddle opposite the mandrel had a few degrees of freedom, which could be controlled by the winding machine, for being moved relative to the mandrel and therefore determining the application of the impregnated roving to the rotating mandrel.

The impregnated roving was applied to the mandrel using a program entered into the machine. The result was a winding pattern that led to the intended spatially varying wall thickness of the wound roving/resin combination. Part of the winding pattern contains a winding layer that passes over the pole of the mandrel (at the dome). After reaching the set-point wall thicknesses that, in this fresh state, were significantly more than those of the finished support crucible, the winding process was ended and excess resin was removed.

The wound mandrel was ready to be transported after a short time, was taken out of the winding machine and put into a curing chamber. There, the resin of the roving/resin combination was cured on the mandrel at from 120 to 140° C. for a few hours.

The resulting CFC preform was separated from the mandrel and carbonized under a protective gas at temperatures of up to 1000° C. The further production steps necessary for a CFC support crucible were then carried out: impregnation two times with phenolic resin and carbonization, graphitization, processing, purifying graphitization and impregnation with pyrocarbon.

Other features which are considered as characteristic for the invention are set forth in the appended claims.

Although the invention is illustrated and described herein as embodied in a durable CFC support crucible for high-temperature processes in the pulling of semiconductor single crystals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a diagrammatic, sectional view parallel to a longitudinal axis through a rotationally symmetric wound CFC support crucible.

DESCRIPTION OF THE PREFERRED EMBODIMENTS

Referring now to the single FIGURE of the drawing in detail, there is shown a typical wall thickness d of a CFC support crucible 1 which is one percent of a maximum support crucible diameter D. The FIGURE shows a larger wall thickness in the central region 6 of a curved bottom 2 than in a cylindrical part 3 of the support crucible 1. Rotationally symmetric folds or notches 4 are often made in this region by machining on the outside, that is to say at the bottom of the support crucible 1, these being used to position the support crucible 1 securely on a non-illustrated support.

A thickening 5 according to the invention can be seen in cross section in a transition region from the cylindrical or substantially cylindrical, slightly conically widening part 3 to the curved bottom 2 of the support crucible 1. It is oriented on the outside, extending away from the central longitudinal axis of the support crucible. The thickening 5 amounts to at least 15%, preferably from 20 to 50%, of the wall thickness d of the cylindrical or substantially cylindrical, slightly conically widening part 3. The thickening 5 is not represented true to scale in the figure, but instead schematically exaggerated. The thickening 5 extends over a length "a" of at least 10% of the cylindrical or substantially cylindrical, slightly conically widening part 3, and subsequently over a length "b" of at least 60% of the length of the section line through the curved bottom of the support crucible from the central longitudinal axis of the support crucible 1 to the start of the cylindrical or substantially cylindrical, slightly conically widening part 3 of the support crucible 1.

This application claims the priority, under 35 U.S.C. § 119, of German patent application No. 103 21 785.1, filed May 14, 2003; the entire disclosure of the prior application is herewith incorporated by reference.

I claim:

1. A support crucible for supporting quartz glass crucibles, the support crucible and the supporting quartz glass crucibles being used together in high temperature processes of semiconductor technology including a pulling of single crystals by a Czochralski method from silicon or other semiconductor materials, the support crucible comprising:
a wall formed of a highly pure carbon fiber-reinforced carbon (CFC), produced with an aid of a filament winding method, and having an ash value of less than 500 ppm, said wall having a substantially cylindrical, slightly conically widening part and a curved bottom part, said wall having a wall thickness in a transition region from said substantially cylindrical, slightly conically widening part to said curved bottom part being thickened with respect to said substantially cylindrical, slightly conically widening part by at least 15%.

2. The support crucible according to claim 1, wherein said transition region includes at least 10% of a length of said substantially cylindrical, slightly conically widening part, said transition region includes at least 60% of a length of a section line through said curved bottom part from a central longitudinal axis of the support crucible to a start of said substantially cylindrical, slightly conically widening part.

3. The support crucible according to claim 1, wherein said transition region contains a CFC material having fiber strands laid tightly together and without an offset with the filament winding method.

4. The support crucible according to claim 3, wherein said wall has a net inner contour configured so that a rotationally symmetric quartz glass crucible located in the support crucible can be removed at any time.

5. The support crucible according to claim 1, wherein said wall thickness in said transition region is formed only on an outer side of said wall and extends away from a central longitudinal axis of the support crucible.

6. The support crucible according to claim 1, wherein said wall is infiltrated with pyrocarbon.

7. The support crucible according to claim 6, wherein said wall is infiltrated with said pyrocarbon using a chemical vapor infiltration method.

8. The support crucible according to claim 1, wherein said wall thickness in said transition region being thickened with respect to said substantially cylindrical, slightly conically widening part in a range of from 20 to 50%.

* * * * *